(12) United States Patent
Dewa

(10) Patent No.: US 6,752,931 B2
(45) Date of Patent: Jun. 22, 2004

(54) METHOD FOR USING DRIE WITH REDUCED LATERAL ETCHING

(75) Inventor: Andrew S. Dewa, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 78 days.

(21) Appl. No.: 10/216,525

(22) Filed: Aug. 9, 2002

(65) Prior Publication Data

US 2004/0011761 A1 Jan. 22, 2004

Related U.S. Application Data

(60) Provisional application No. 60/342,248, filed on Dec. 21, 2001.

(51) Int. Cl.$^7$ .............................. C23F 1/00; H01L 21/00
(52) U.S. Cl. ........................................... 216/2; 438/700
(58) Field of Search ................................ 216/2, 11, 58; 438/464, 694, 700, 702, 710

(56) References Cited

U.S. PATENT DOCUMENTS

2003/0162402 A1 * 8/2003 Song et al. .................. 438/710

OTHER PUBLICATIONS

A. A. Ayon, et al., "Tailoring Etch Directionally in a Deep Reactive Ion Etching Tool," The 10th International Conference on Solid–State Sensors and Actuators, Digest of Technical Papers, vol. 2, 1999, pp. 854–857, Transducers '99. Microsystems Technology Laboratories, Gas Turbine Laboratory Massachusetts Institute of Technology, Cambridge, MA 02319.

Ravi Khanna et al., "Microfabrication Protocols for Deep Reactive Ion Etching and Wafer–Level Bonding", Sensors, Apr. 2001.*

* cited by examiner

Primary Examiner—Evan Pert
(74) Attorney, Agent, or Firm—William B. Kempler; W. James Brady, III; Frederick J. Telecky, Jr.

(57) ABSTRACT

A process for manufacturing a wafer having a multiplicity of MEMS devices such as mirrors with gimbals formed thereon is disclosed. A silicon wafer having a thickness less than about 300 $\mu$m is attached to a carrier or support wafer by a layer of bonding agent such as a layer or coating of photo-resist. The MEMS devices such as a gimbal mirror are formed on the silicon wafer by providing a mask and etching through the wafer with a DRIE process. Undesired lateral etching at the bottom of the wafer caused by the formation of an electrical charge at the bonding layer is eliminated or substantially reduced by patterning the layer of photo-resist used as the bonding agent such that areas of the support wafer not covered by the bonding layer are aligned with selected etch lines which etch completely through the silicon wafer to form devices.

27 Claims, 4 Drawing Sheets

METHOD FOR USING DRIE WITH REDUCED LATERAL ETCHING

This patent claims the benefit of U.S. Provisional Patent Application No. 60/342,248, filed Dec. 21, 2001, which is incorporated herein by reference.

FIELD OF THE INVENTION

This unit relates generally to apparatus and methods for manufacturing MEMS (micro-electromechanical systems) by forming a multiplicity of such devices on a wafer (such as silicon) using a DRIE (Deep Reactive Ion Etch) process. More specifically, the invention relates to a method of reducing undesired lateral etching while using such a manufacturing process.

BACKGROUND OF THE INVENTION

Texas Instruments presently manufactures a two-axis MEMS type analog mirror device fabricated out of a single piece or sheet of material (such as a silicon wafer) typically having a thickness of about 115 $\mu$m. The die layout defines an oval mirror, normally 3.8 mm×3.2 mm supported on a gimbal frame by two torsional hinges which typically have a width on the order of about 8 microns. The gimbal frame is attached to the die frame by another orthogonal set of torsional hinges. The mirror die (i.e. each individual device) is fabricated by Deep Reactive Ion Etching (DRIE) the 115 $\mu$m thick silicon wafer in a specialized ICP (Inductively Coupled Plasma) reactor.

As will be appreciated, the operation of the gimbal mirror depends upon the effectiveness, integrity and resilient support of the very narrow integrally formed torsional hinges. Therefore, it will also be appreciated that etching variations while forming the hinge can result in an unsatisfactory or even a failed mirror device.

One method of manufacturing the MEMS type mirror device discussed above is to bond a silicon wafer, which is typically less than 300 microns in thickness (and typically on the order of about 115 microns), to a thicker support or carrier wafer by using a coating or layer of a bonding agent or adhesive. Typically, the bonding agent provides a temporary bond such as is provided by a photo-resist or other organic layer of material such as "Wafer Grip" available from Dynatex of Santa Rosa, Calif. The MEMS components are then formed by etching completely "through the wafer" to the temporary bonding layer.

When the etching has progressed through or substantially through the is layer or wafer, the positively charged ion particles used to etch the wafer encounter the temporary bonding layer (such as photo-resist). This insulating layer of photo-resist is then positively charged by the impinging charged ions such that subsequent charged etching ions are repelled from the silicon wafer. Many of these repelled ions then encounter and laterally etch or erode the bottom of the wafer adjacent the location of the side wall of the etched area of line. Since as mentioned above, the torsional hinges of the mirror are on the order of only eight microns wide, this lateral etching can erode the silicon completely across the bottom of the hinge. Therefore, a method of etching through a wafer without lateral etching at the bottom surface of the wafer would improve the process.

The present invention relates to individual mirror devices formed on a wafer using processing steps which eliminate or substantially reduce undesirable lateral etching. Some of the processing steps are similar to steps used in manufacturing IC's and other semiconductor devices.

SUMMARY OF THE INVENTION

The present invention provides a process for manufacturing one or more MEMS devices on a first layer of material, such as for example, a thin wafer of silicon typically having a thickness of less than about 300 $\mu$m (microns) and according to one embodiment about 115 $\mu$m. The process comprises providing a bonding agent such as a photo-resist on a backing layer or carrier wafer made of a conductive or semiconductive material. The bonding layer is applied and/or patterned on the surface of the backing layer of material so as to define uncoated areas of the backing layer. A silicon wafer or first layer of material is then attached to the backing layer with the bonding agent. A mask, such as a photo-lithography mask, is then applied or provided on the silicon wafer or first layer of material so as to define a pattern of etch areas and/or lines. Selected ones of the etch areas or lines of the mask are aligned with selected ones of the uncoated areas of the backing layer. The first layer of material, such as a silicon wafer, is then etched through the mask to form the MEMS device type mirrors. The devices are then separated from the backing layer.

Although as described above the first layer may be a silicon wafer, it should also be noted that the first layer used to manufacture the mirrors or the devices could be another suitable material. Further, the first layer or wafer may also undergo other processes before the device is etched. For example, electronics, sensors or other mechanical features can be created by standard IC or MEMS fabrication steps before proceeding to the etching step that forms the mirror.

BRIEF DESCRIPTION OF THE DRAWINGS

The above-mentioned features as well as other features of the present invention will be more clearly understood from consideration of the following description in connection with the accompanying drawings in which.

DESCRIPTION OF PREFERRED EMBODIMENTS

U.S. Pat. No. 6,295,154 to Laor et al. and assigned to the same assignee as the present invention discloses a two-axis analog mirror MEMS device used in optical switching apparatus. However, the unique mirror device has been found to have many other applications and uses. The present invention discloses an improved process suitable for manufacturing a two-axis analog mirror MEMS device from a single piece of material (such as a silicon wafer, for example) typically having a thickness of less than about 300 $\mu$m, and according to one embodiment about 115 $\mu$m. The die layout consists of an oval mirror, normally 3.8 mm×3.2 mm supported on a gimbal frame by two torsional hinges.

The gimbal frame is attached to the die frame by another orthogonal set of torsional hinges. According to one embodiment, the mirror die (i.e., each individual device) of this improved process is fabricated by using a deep reactive ion etch (DRIE) of a 115 μm thick silicon wafer in a specialized ICP (Inductively Coupled Plasma) reactor in a manner that eliminates or substantially reduces lateral etching at the bottom of the torsional hinges.

Figure 1A:
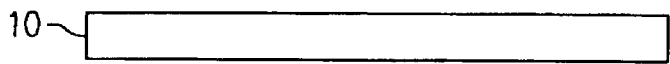
FIGS. 1A through 1H illustrate the various steps of a manufacturing process.
Figure 1B:
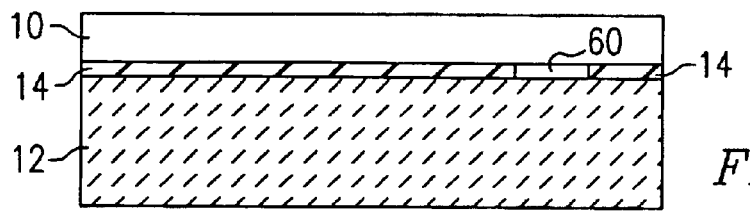

The process flow of one method of manufacturing such a two-axis analog mirror MEMS device is disclosed in FIGS. 1A–1H. As shown in FIG. 1A, a 115 μm thick first layer 10, such as a silicon wafer, is bonded to a backing layer 12, such as a support or carrier wafer made from a material which is a conductor or a semiconductor (see FIG. 1B). The first layer or wafer 10 is bonded to the backing layer or wafer 12 by a layer or coating 14 of an adhesive or bonding agent. An example of one suitable bonding agent is a temporary organic bonding agent, such as a thin layer or coating 14 of photo-resist or "Wafer Grip". As will be discussed in more detail hereinafter in accordance with the teachings of the present invention, the layer of bonding agent or photo-resist is patterned so as to define voids or areas of the support wafer not covered by the bonding agent, such as void 60. These uncovered areas are aligned with and correspond to areas of the silicon wafer where lines defining selected and/or critical elements of the MEMS device will etch completely through the silicon wafer.

Figure 1C:
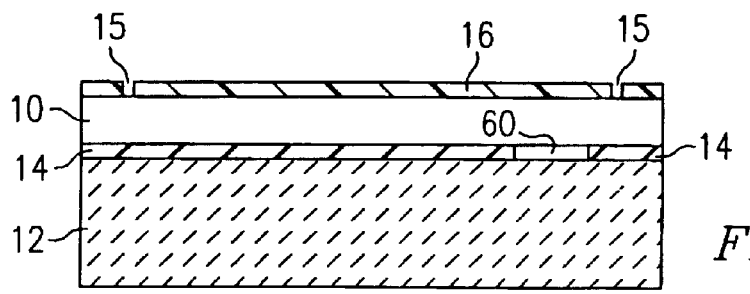
Figure 1D:
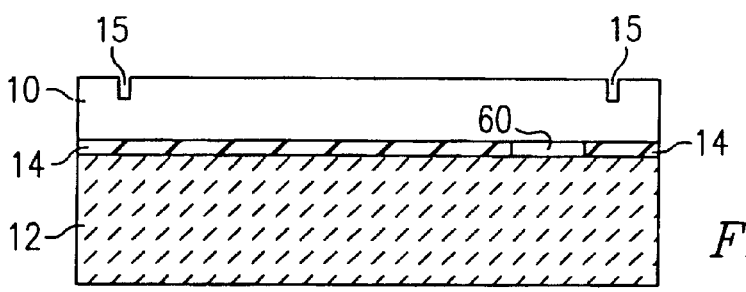
Figure 1E:
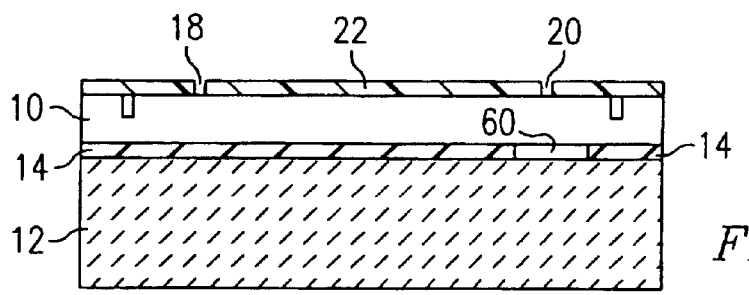
Figure 1F:
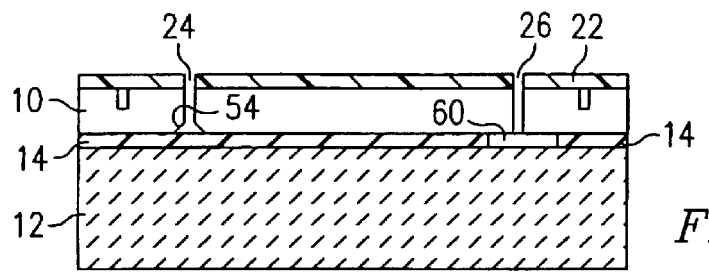

Optional alignment marks 15 may then be etched into the thin silicon wafer or other suitable material using a resist layer 16 along with photolithography and plasma etching as shown in FIG. 1C. After the plasma etch, the resist 16 used to form the optional alignment marks 15 is then stripped as shown in FIG. 1D. The features and/or boundaries of the mirror(s) or MEMS device(s) are then defined or patterned in a mask 22 such as indicated by line pattern or gaps 18 and 20, and as may be provided by a second resist layer and a photolithography process as is well known by those skilled in the art. This arrangement is shown in FIG. 1E. As shown in FIG. 1F, the mirror features and/or device boundaries defined by gap or line pattern 18 and 20 in mask 22 may then be etched completely through the wafer 10 as indicated by reference numbers 24 and 26 using a special ICP reactor and the Bosch process described in U.S. Pat. No. 5,498,312. As will be discussed later, gap 24 shown in FIGS. 1F, 1G and 1H was not etched according to the teachings of this invention and an area 54 was eroded at the bottom of gap 24. However, gap 26 was etched according to the teachings of the invention and the erosion at the bottom of gap 26 has been eliminated.

Figure 1G:
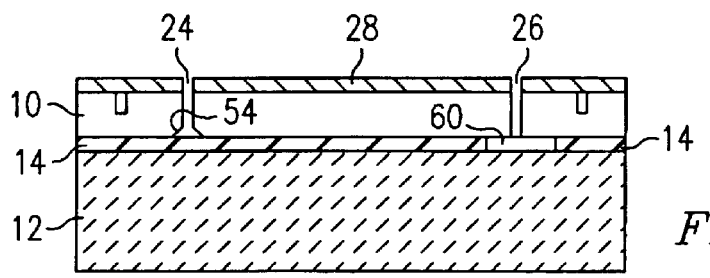
Figure 1H:
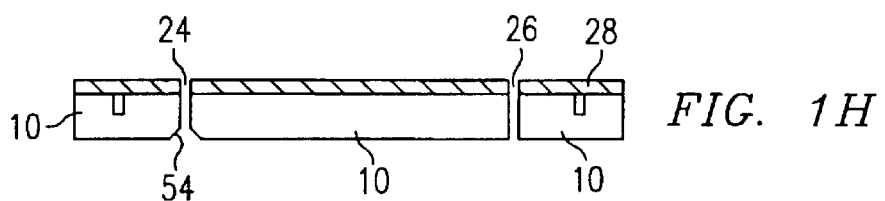

After the etching process, the mask or second photo-resist layer 22 is stripped away, and the wafer, while still bonded to the support or backing wafer, may be given a gold coat 28 such as shown in FIG. 1G. Finally, the mirror die or individual mirror(s) with the gold coating 28 is released from the carrier wafer 12 as shown in FIG. 1H. This may be accomplished by placing the combination carrier or backing wafer 12 and the wafer 10 in a solvent bath to dissolve the agent bonding the carrier wafer 12 and wafer 10 together. The bonding agent is typically a photo-resist. According to one embodiment, the solvent for separating the backing wafer 12 from the wafer 10 is acetone.

Figure 2:
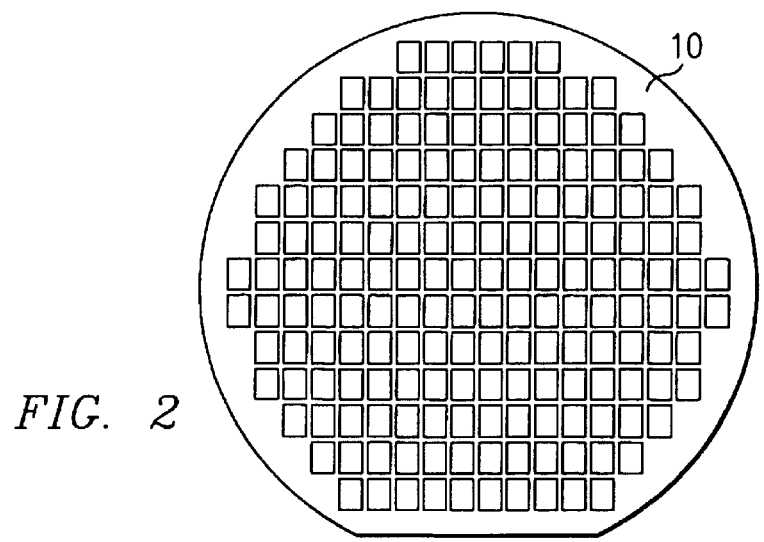
FIG. 2 illustrates a mirror wafer.

FIG. 2 illustrates a wafer 10 with a plurality of individual mirrors etched therein. As can be seen, the illustrated embodiment shows 178 individual mirrors or dies etched or defined in the wafer 10.

Figure 3:
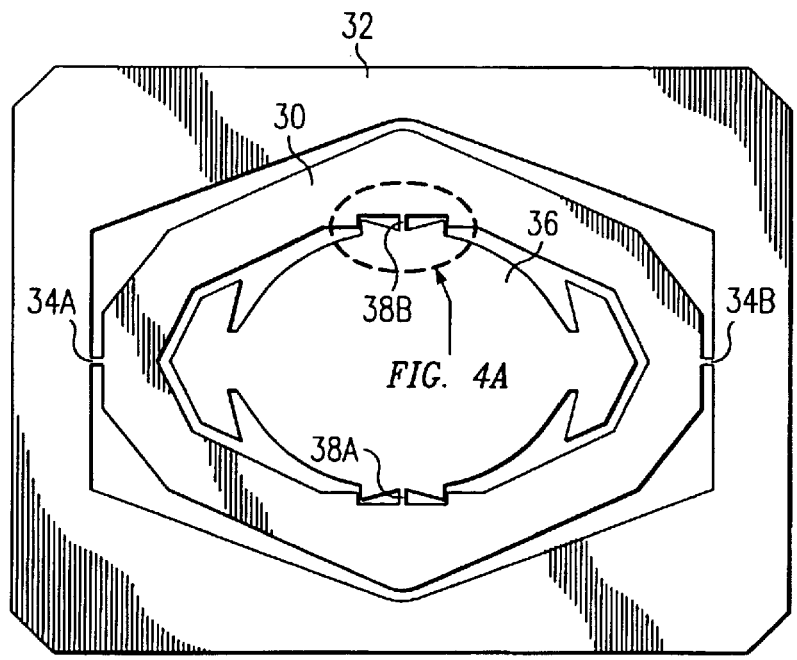
FIG. 3 is a top view of a two-axis gimbal mirror formed by the process of the present invention.

FIG. 3 is an enlarged view of one of the 178 two-axis gimbal mirrors illustrated in the wafer 10 FIG. 1, and suitable for manufacture by the process of this invention. The two-axis mirror device includes a gimbal support structure 30 attached to a support frame portion 32 by a first pair of torsional hinges 34A and 34B. In a similar manner, a mirror portion 36 is attached to the gimbal support structure 30 in a similar manner by a second pair of torsional hinges 38A and 38B. As will be appreciated, the first pair 34A and 34B and second pair 38A and 38B of torsional hinges, along with one or more alignment stops, such as alignment stops 40A and 40B discussed below, have critical dimensions which must be achieved if the mirror is to function or rotate properly. More specifically, the torsional hinges 34A, 34B, and 38A, 38B are on the order of about eight micron (8 μm) in width with a thickness of about 115 μm (i.e., the wafer thickness).

Figure 4A:
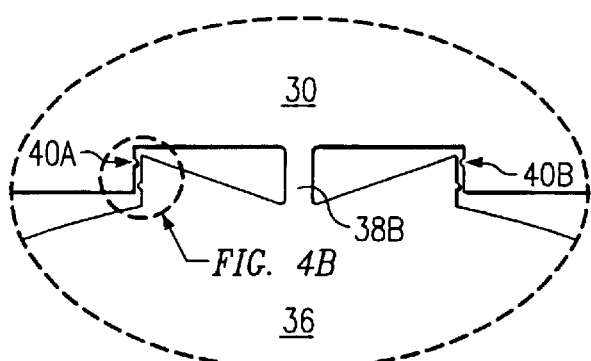
FIGS. 4A and 4B are detailed drawings of a torsional hinge and an alignment stop of the gimbal mirror of FIG. 3.
Figure 4B:
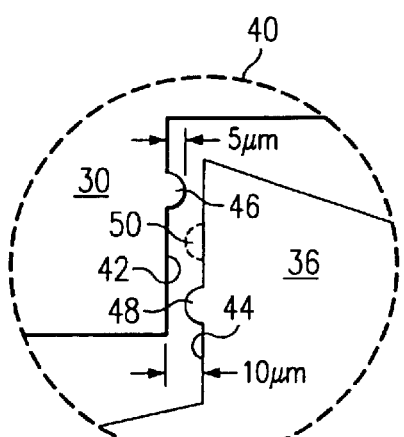

Alignment stops 40A and 40B may be located on both sides of the torsional hinges as shown in the enlarged view of FIG. 4A. Although U.S. Pat. No. 6,295,154, mentioned above, also disclosed alignment stops, the alignment stops 40A and 40B of this invention extend perpendicular to the torsional hinge axis, whereas the alignment stops disclosed in the U.S. Pat. No. 6,295,154 patent extend parallel to the torsional hinges. According to other embodiments as illustrated in FIG. 4B, an alignment stop 46 may be formed on one of a pair of parallel edges such as edge 42 on gimbal support structure 30 and edge 44 on mirror portion 36 which are spaced apart by a gap on the order of only 10 μm. However, there may also be a protrusion formed on the second one of the two parallel edges, such as protrusion 48 formed at edge 44 of mirror portion 36. It will also be appreciated that more than one protrusion may extend into the gap defined by the two parallel edges and that a protrusion may extend into the 10 μm gap from either one of the parallel edges such as indicated by protrusion 50 shown in dotted lines on edge 44. The protrusion will narrow the space between gimbal support 30 and mirror portion 36 to about 5 μm as also shown in FIG. 4B. Because of the effects of microloading, where features of different sizes etch at different rates, it can be difficult to develop an etch recipe for the ICP reactor that etches large open areas at the same rate as the narrow stops. Typically the narrow stops etch slower than the large open areas. Therefore, to fully etch the lateral alignment stops, the rest of the pattern must be over etched. This causes the 8 μm wide hinge to be very susceptible to the undercutting if the wafer is not etched as taught in the invention.

As mentioned above, the process of the present invention relates to individual mirror devices formed on a wafer using processing steps, some of which have similarity to steps used in manufacturing IC's and other semiconductor devices, and advantageously follows the method discussed above with respect to FIGS. 1A through 1H from FIG. 1A through FIG. 1D.

However, as discussed above, it is important that the Deep Reactive Ion Etching (DRIE) process used to form the MEMS component in a first layer of material such as a silicon wafer does not erode the bottom surface of the layer in the area of selected features such as the torsional hinge and/or alignment stop in a mirror structure.

Figure 5A:
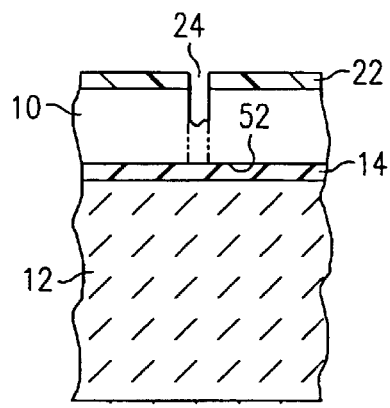
FIGS. 5A and 5B illustrate an enlarged view of the phenomenon of lateral etching caused by a charge build up on the bonding layer between the backing layer and a wafer intended for etching.
Figure 5B:
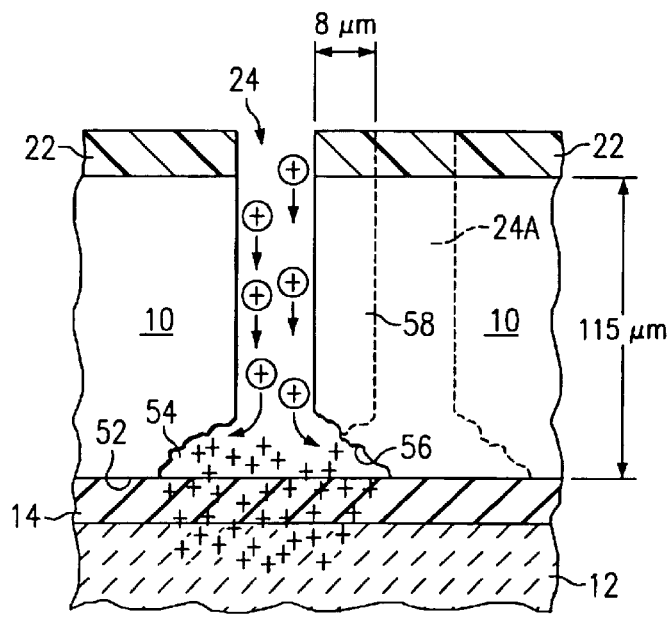

Referring now to FIGS. 5A and 5B and 6A and 6B, a technique used by the present invention to avoid such etching or erosion is discussed. FIGS. 5A and 5B illustrate how etching through the wafer to the bonding agent 14 without incorporating the teachings of this invention (such as etching line or gap 24 of FIG. 1F) may result in etching or erosion of the bottom surface 52 of first layer 10 (such as a silicon wafer). As shown in FIG. 1F and FIG. 5A, gap 24 is partially etched through the wafer and that the layer of bonding agent (which may be a photo-resist) extends under the gap or line 24. The enlarged view of FIG. 5B illustrates how charged ion particles used to etch gap 24 in first layer 10 are defined by mask 22 may result in a like charge building up on the non-conductive layer of photo-resist or bonding agent 14 after the layer 10 has been completely etched through. It should also be appreciated that a bonding tape such as a "Wafer Grip" available from Dynatex of Santa Rosa, Calif. may be used as the bonding agent 14. The charge build up on the non-conductive bonding agent 14 will then repel any subsequent and similarly charged ion particles which may result in lateral etching or erosion of the bottom surface 52 of layer 10 as illustrated at 54 and 56. For large areas or elements being formed in the layer or wafer 10 by the etching process the amount of erosion or lateral etching may not present a problem. However for small elements, such as the torsional hinge 38, lateral etching may cause excessive damage to the hinge so as to affect the structural integrity or cause an unacceptable change in the resonant frequency. For example, referring again to FIG. 5B, if it is assumed that layer 10 is a 115 $\mu$m silicon wafer and a second line or gap 24A as indicated by dashed line is also etched in layer 10 to form an 8 $\mu$m torsional hinge, it is clear that lateral etching can clearly etch away the bottom area of the torsional hinge structure 58 as indicated at 56.

It will be appreciated by those skilled in the art that although silicon is often preferred for such processes, other suitable materials such as, but not limited to, gallium arsenide, Indium phosphide and silicon carbide may also be used.

Figure 6A:
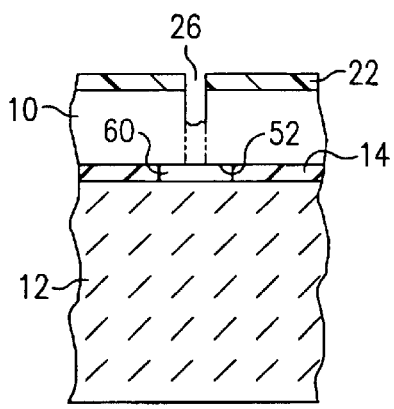
FIGS. 6A and 6B are an enlarged view illustrating the inventive process of the present invention which eliminates or substantially reduces the lateral etching phenomenon.
Figure 6B:
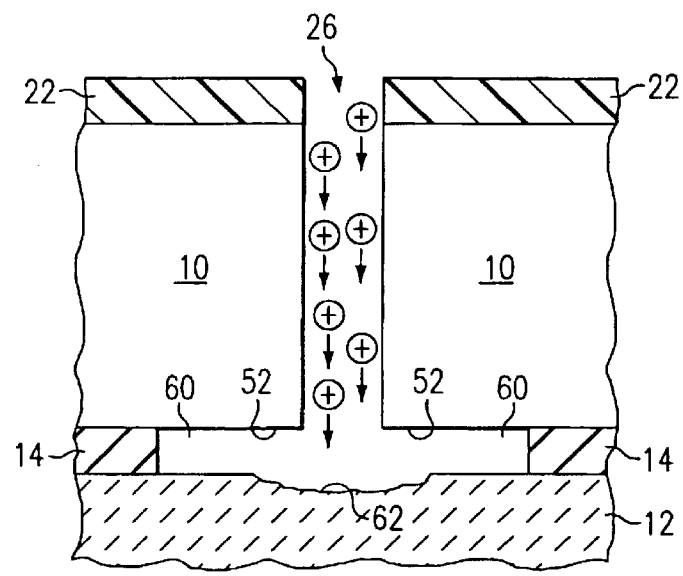

Referring now to gap 26 of FIG. 1H along with FIGS. 6A and 6B, there is shown how the process of the present invention eliminates or substantially reduces such lateral etching of the bottom of layer 10. As is seen in the figure, the layer of non-conductive bonding agent 14 (such as photo-resist) is patterned so as to define voids in the photo-resist which are aligned so that they correspond to the pattern of "through the wafer etch lines" as defined by the pattern in mask 22. That is, the layer of bonding agent defines a void or uncovered area 60 of the conductive or semiconductive support wafer 12 below at least selected ones of the lines or gaps to be etched completely "through the wafer" 10 as indicated by gap 26.

Patterning or etching of the bonding agent 14 (such as photoresist or Wafer Grip) may be accomplished by any suitable process. For example, standard photolithography may be used to pattern a mask on a photoresist bonding layer. The masked layer is then etched according to standard methods. Alternately, the desired void areas may be punched into a bonding tape with an appropriate stamp and die.

Consequently, the charged ion particles such as used to etch gap 26 do not encounter the insulating photo-resist layer (bonding agent) after etching through the wafer such that there is no charge build up, because the carrier wafer is typically a semiconductor. Alternately, the carrier wafers may be conductive. Thus, if charged ion particles are directed through gap or layer 26 after the wafer 10 is completely etched through, the particles may etch the surface of support or carrier wafer 10 as shown at 62, but the conductive or semiconductive support member or carrier wafer 12 allows the electrical charge to dissipate such that there is no charge build up as discussed with respect to FIGS. 5A and 5B and therefore no repelled ion particles which cause lateral etching of the bottom of layer 10.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

I claim:

1. A process for manufacturing a MEMS device on a first layer of material comprising the steps of:

providing a bonding agent on a backing layer made of a material that has at least the electrical conductivity of a semiconductor, said bonding agent defining uncoated areas of said backing layer of material;

attaching a first layer of material to said backing layer of material with said bonding agent;

providing a mask on said first layer of material;

defining a pattern of etch lines with said mask such that selected ones of said etch lines defined by said mask are aligned with selected ones of said uncoated areas of said backing layer; and etching through said first layer of material according to said pattern defined by said mask so as to form said MEMS device.

2. The process of claim 1 further comprising the step of releasing said formed MEMS device from said backing layer.

3. The process of claim 1 wherein said first layer of material is selected from the group consisting of silicon, gallium arsenide, indium phosphide and silicon carbide.

4. The process of claim 1 wherein said first layer of material is silicon.

5. The process of claim 1 wherein said first layer of material has a thickness less than about 300 $\mu$m.

6. The process of claim 1 wherein said first layer of material has a thickness of about 115 $\mu$m.

7. The process of claim 4 wherein said first layer is a silicon wafer.

8. The process of claim 1 wherein said steps of providing a mask and defining a pattern of etch lines comprises the steps of depositing a resist layer over said layer of material and patterning said etch lines on said resist layer with photolithography.

9. The process of claim 3 wherein said steps of providing a mask and defining etch lines comprises the steps of depositing a resist layer and patterning said etch lines on said resist with photolithography.

10. The process of claim 1 wherein said etching step comprises the steps of using an ICP reactor and the Bosch process.

11. The process of claim 8 further comprising stripping away said resist layer subsequent to said etching step.

12. The process of claim 2 further comprising depositing a gold coating on said etched layer of material prior to said separating step.

13. The process of claim 1 wherein said selected ones of said etch lines define a torsional hinge for a gimbal mirror.

14. The process of claim 1 wherein said selected ones of said etch lines define a torsional hinge and an alignment stop for a gimbal mirror.

15. The process of claim 1 wherein said selected ones of said etch lines define an alignment stop for a gimbal mirror.

16. The process of claim 1 wherein said mask defines a plurality of gimbal mirrors and said selected ones of said etch lines define torsional hinges of said gimbal mirrors.

17. The process of claim 1 wherein said backing layer is made from a conductive material.

18. The process of claim 1 wherein said step of defining a pattern comprises the steps of using photolithography to pattern a layer of photoresist and then etching said pattern layer of photoresist.

19. The process of claim 1 wherein said step of defining a pattern comprises the steps of punching a selected pattern in a bonding tape and then applying said bonding tape with said selected pattern to said backing layer.

20. A process for manufacturing a plurality of gimbal mirror devices on a silicon wafer comprising:

providing a bonding agent on a support wafer made of a material that has at least the electrical conductivity of a semiconductor, said bonding agent defining uncoated areas of said support wafer;

attaching a silicon wafer to said support wafer with said bonding agent;

providing a mask on said silicon wafer;

defining a pattern of a plurality of gimbal mirror etch lines with said mask and such that selected ones of said etch lines define a torsional hinge of said gimbal mirror and are aligned with selected ones of said uncoated areas of said support wafer; and etching said lines until said lines are etched through said silicon wafer.

21. The process of claim 20 wherein said silicon wafer has a thickness of about 115 $\mu$m.

22. The process of claim 20 wherein other selected ones of said etch lines define an alignment stop for said gimbal mirror.

23. The process of claim 20 further comprising depositing a gold coating on said etched silicon wafer prior to said separating step.

24. The process of claim 20 wherein said step of providing a mask and said step of defining comprise depositing a resist layer over said layer of material and patterning said etch lines on said resist layer with photolithography.

25. The process of claim 20 wherein said support wafer is made from a conductive material.

26. The process of claim 20 wherein said step of defining a pattern comprises the steps of using photolithography to pattern a layer of photoresist and then etching said pattern layer of photoresist.

27. The process of claim 20 wherein said step of defining a pattern comprises the steps of punching a selected pattern in a bonding tape and then applying said bonding tape with said selected pattern to said backing layer.

* * * * *